United States Patent
Liu et al.

(10) Patent No.: US 10,411,140 B2
(45) Date of Patent: Sep. 10, 2019

(54) INTEGRATED CANTILEVER SWITCH

(71) Applicant: STMICROELECTRONICS, INC., Coppell, TX (US)

(72) Inventors: Qing Liu, Irvine, CA (US); John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/892,028

(22) Filed: Feb. 8, 2018

(65) Prior Publication Data
US 2018/0182902 A1    Jun. 28, 2018

Related U.S. Application Data (60) Continuation of application No. 15/260,206, filed on Sep. 8, 2016, now Pat. No. 9,905,706, which is a
(Continued)

(51) Int. Cl.
*B81B 7/02* (2006.01)
*H01L 29/84* (2006.01)
(Continued)

(52) U.S. Cl.
CPC ............... *H01L 29/84* (2013.01); *B82B 3/00* (2013.01); *H01H 1/0094* (2013.01);
(Continued)

(58) Field of Classification Search
CPC ........ B81B 7/02; B81B 7/0051; B81B 7/0006
See application file for complete search history.

(56) References Cited

U.S. PATENT DOCUMENTS 5,880,921 A    3/1999  Tham et al.
6,377,438 B1   4/2002  Deane et al.
(Continued)

FOREIGN PATENT DOCUMENTS

CN    102034648 A    4/2011
CN    103723674 A    4/2014
(Continued)

OTHER PUBLICATIONS

Bouwstra et al., "Thermal base drive for micromechanical resonators employing deep-diffusion bases," *Sensors and Actuators A* 37:38-44, 1993.
(Continued)

*Primary Examiner* — Trang Q Tran
(74) *Attorney, Agent, or Firm* — Seed Intellectual Property Law Group LLP (57) ABSTRACT

An integrated transistor in the form of a nanoscale electromechanical switch eliminates CMOS current leakage and increases switching speed. The nanoscale electromechanical switch features a semiconducting cantilever that extends from a portion of the substrate into a cavity. The cantilever flexes in response to a voltage applied to the transistor gate thus forming a conducting channel underneath the gate. When the device is off, the cantilever returns to its resting position. Such motion of the cantilever breaks the circuit, restoring a void underneath the gate that blocks current flow, thus solving the problem of leakage. Fabrication of the nano-electromechanical switch is compatible with existing CMOS transistor fabrication processes. By doping the cantilever and using a back bias and a metallic cantilever tip, sensitivity of the switch can be further improved. A footprint of the nano-electromechanical switch can be as small as $0.1 \times 0.1\ \mu m^2$.

20 Claims, 10 Drawing Sheets

Related U.S. Application Data division of application No. 14/675,359, filed on Mar. 31, 2015, now Pat. No. 9,466,452.

(51) Int. Cl.

| | | |
|---|---|---|
| *H01H 59/00* | (2006.01) | |
| *B82B 3/00* | (2006.01) | |
| *H01H 1/00* | (2006.01) | |
| *H01H 49/00* | (2006.01) | |
| *H01L 21/02* | (2006.01) | |
| *H01L 21/306* | (2006.01) | |
| *H01H 50/00* | (2006.01) | |

(52) U.S. Cl.
CPC ........ *H01H 49/00* (2013.01); *H01H 59/0009* (2013.01); *H01L 21/02532* (2013.01); *H01L 21/30608* (2013.01); *H01H 50/005* (2013.01); *H01H 2001/0084* (2013.01)

(56) References Cited

U.S. PATENT DOCUMENTS

| | | | |
|---|---|---|---|
| 6,498,347 B2 | 12/2002 | Sauer et al. | |
| 6,646,215 B1 | 11/2003 | Nelson | |
| 7,657,995 B2 | 2/2010 | Hsu et al. | |
| 7,960,804 B1 | 6/2011 | Ebel et al. | |
| 8,264,054 B2 | 9/2012 | Cunningham et al. | |
| 8,310,053 B2 | 11/2012 | Verheijden et al. | |
| 8,313,970 B2 | 11/2012 | Quevy et al. | |
| 8,564,387 B1 | 10/2013 | Hammond | |
| 8,604,898 B2 | 12/2013 | Anderson et al. | |
| 8,609,450 B2 | 12/2013 | Gambino et al. | |
| 8,610,256 B2 | 12/2013 | Fornara et al. | |
| 8,692,247 B2 | 4/2014 | Fornara et al. | |
| 8,704,327 B2 | 4/2014 | Rivero et al. | |
| 8,884,289 B2 | 11/2014 | Fornara et al. | |
| 2005/0146404 A1 | 7/2005 | Yeatman | |
| 2005/0189204 A1 | 9/2005 | Yeatman et al. | |
| 2006/0145793 A1 | 7/2006 | Ning et al. | |
| 2006/0180898 A1* | 8/2006 | Funaki ............... | B81C 1/00246 257/619 |
| 2006/0285255 A1 | 12/2006 | Kawakubo et al. | |
| 2007/0183116 A1 | 8/2007 | Combi et al. | |
| 2007/0262401 A1 | 11/2007 | Yokoyama et al. | |
| 2008/0093691 A1 | 4/2008 | Busta | |
| 2008/0217149 A1 | 9/2008 | Schmid et al. | |
| 2008/0224241 A1 | 9/2008 | Inaba et al. | |
| 2008/0227286 A1 | 9/2008 | Gaillard | |
| 2010/0038731 A1 | 2/2010 | Van Kampen | |
| 2010/0116632 A1 | 5/2010 | Smith et al. | |
| 2010/0158072 A1 | 6/2010 | Fornara et al. | |
| 2010/0237738 A1 | 9/2010 | Smith et al. | |
| 2010/0275904 A1 | 11/2010 | Bathurst et al. | |
| 2011/0037132 A1 | 2/2011 | Hsu et al. | |
| 2011/0037160 A1 | 2/2011 | Hsu et al. | |
| 2011/0051309 A1 | 3/2011 | Furukawa et al. | |
| 2011/0063773 A1 | 3/2011 | Ikehashi | |
| 2011/0067982 A1 | 3/2011 | Schmit et al. | |
| 2011/0067983 A1 | 3/2011 | Keimel et al. | |
| 2012/0009774 A1 | 1/2012 | Fornara et al. | |
| 2012/0134121 A1 | 5/2012 | Kanemoto et al. | |
| 2012/0280393 A1 | 11/2012 | Kaynak et al. | |
| 2012/0306017 A1 | 12/2012 | Edelstein et al. | |
| 2013/0146873 A1 | 6/2013 | Fornara et al. | |
| 2013/0147004 A1 | 6/2013 | Rivero et al. | |
| 2013/0306937 A1 | 11/2013 | Cao et al. | |
| 2014/0106552 A1 | 4/2014 | Chang et al. | |
| 2014/0154851 A1 | 6/2014 | Guo et al. | |
| 2014/0167908 A1 | 6/2014 | Fornara et al. | |
| 2014/0191385 A1 | 7/2014 | Di-Giacomo | |
| 2014/0266562 A1 | 9/2014 | Di-Giacomo et al. | |
| 2014/0300249 A1 | 10/2014 | Van Kampen et al. | |
| 2014/0319653 A1 | 10/2014 | Fornara et al. | |
| 2014/0360851 A1 | 12/2014 | Rivero et al. | |
| 2015/0162448 A1 | 6/2015 | Raghavan et al. | |

FOREIGN PATENT DOCUMENTS

| | | |
|---|---|---|
| EP | 2 154 635 A1 | 2/2010 |
| EP | 2 202 767 A1 | 6/2010 |
| EP | 2 635 498 A1 | 9/2011 |
| FR | 2 852 441 A1 | 9/2004 |
| FR | 2 984 009 A1 | 6/2013 |
| FR | 2 984 010 A1 | 6/2013 |
| JP | H10-149950 A | 6/1998 |
| JP | 2006-238265 A | 9/2006 |
| JP | 2006-351296 A | 12/2006 |
| KR | 10-2011-0066395 A | 6/2011 |
| WO | 01/35433 A2 | 5/2001 |
| WO | 2005/069331 A1 | 7/2005 |
| WO | 2013/083385 A1 | 6/2013 |

OTHER PUBLICATIONS

Dereus et al., "Tunable Capacitor Series/Shunt Design for Integrated Tunable Wireless Front End Applications," 2011IEEE24th International Conference on Micro Electro Mechanical Systems (MEMS), Cancun, Mexico, Jan. 23-27, 2011, pp. 805-808.

Kaynak et al., "Characterization of an Embedded RF-MEMS Switch," 2010 Topical Meeting on Silicon Monolithic Integrated Circuits in RF Systems (SiRF), New Orleans, LA, Jan. 11-13, 2010, pp. 144-147.

Konishi et al., "Built-In Upwards-Bending Electrostatic Actuator Capable of Three-Level-Structural Variable Capacitor," TRANSDUCERS 2007 International Solid-State Sensors, Actuators and Microsystems Conference, Lyon, France, Jun. 10-14, 2007, pp. 447-450.

Liao et al., "A Novel Electro-Thermally Driven Bi-directional Microactuator," International Symposium on Micromechatronics and Human Science, 2002, pp. 267-274.

Parameswaran et al., "CMOS Electrothermal Microactuators," IEEE Proceedings, An Investigation of Micro Structures, Sensors, Actuators, Machines and Robots, Napa Valley, CA, Feb. 11-14, 1990, pp. 128-131.

U.S. Appl. No. 14/920,621, "Metallic Device Having Mobile Element in a Cavity of the BEOL of an Integrated Circuit," filed Oct. 22, 2015, 39 pages.

Vayrette et al., "Residual stress estimation in damascene copper interconnects using embedded sensors," Microelectronic Engineering 87:412-415, 2010.

\* cited by examiner

INTEGRATED CANTILEVER SWITCH

BACKGROUND

Technical Field

The present disclosure generally relates to advanced transistor geometries and to electro-mechanical devices integrated with microelectronic circuits.

Description of the Related Art

Figure 1A:
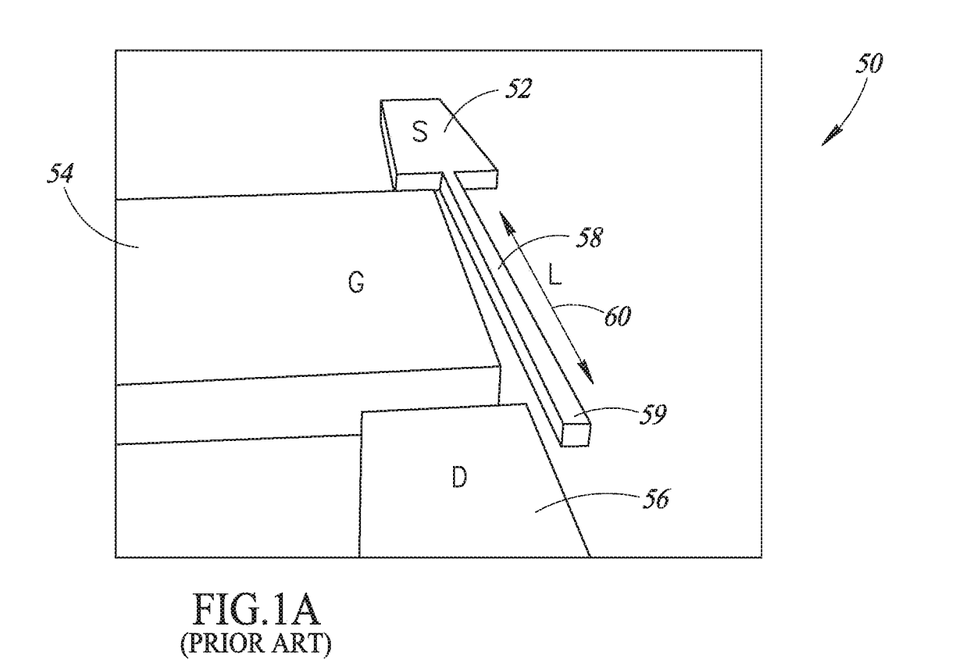
FIG. 1A is a pictorial perspective view of an existing planar MEMs switch 50 according to the prior art.

Micro-electromechanical systems (MEMs) exist that combine electronic devices with mechanical structures to form electronically controlled moving parts for use as miniature sensors and actuators, for example. A typical MEMs device is shown in FIG. 1 as a planar transistor in which the conduction channel is electrically coupled to the source but detached from the drain. When a current is applied to the gate, the detached end of the conduction channel makes contact with the drain, thereby closing the circuit and turning on the transistor switch. Like other MEMs devices, the electrical portion of the device shown in FIG. 1 is disposed next to the mechanical portion, in substantially the same horizontal plane. As a result, the overall footprint is quite large, on the order of $10 \times 10$ µm$^2$, whereas state-of-the-art electronic circuits are now measured in nanometers, about a thousand times smaller than MEMs devices. The relatively large size of current MEMs devices limits their production, packing density, precision, sensitivity, and economic value.

BRIEF SUMMARY

An integrated transistor in the form of a nano-electromechanical switch eliminates current leakage and increases switching speed. The nano-electromechanical switch features a semiconducting cantilever that extends from a portion of the substrate into a cavity. The cantilever flexes in response to a voltage applied to the transistor gate thus forming a conducting channel underneath the gate. When the device is off, the cantilever returns to its resting position, breaking the circuit and restoring a void underneath the gate that does not permit current flow. Hence, the off-state current is forced to be zero, thus solving the problem of leakage. Fabrication of the nano-electromechanical switch is compatible with existing CMOS transistor fabrication processes. Use of a back bias, and a metallic tip on the cantilever can further improve sensitivity of the switch. A footprint of the nano-electromechanical switch can be as small as $0.1 \times 0.1$ µm$^2$.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIGS. 3A-5 are cross-sectional views of the nanoscale electromechanical switch at successive steps during fabrication using the method shown in FIG. 2.

FIGS. 7-8C are cross-sectional views of alternative embodiments to the completed nanoscale electromechanical switch shown in FIGS. 6A-6B.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electroless plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to nano-electromechanical switching devices that have been produced; however, the present disclosure and the reference to certain materials, dimensions, and the details and ordering of processing steps are exemplary and should not be limited to those shown.

Turning now to the figures, FIG. 1A shows an existing planar MEMS switch 50 mounted on top of a substrate. The switch 50 has a source terminal 52, a gate terminal 54, a drain terminal 56, and a cantilever arm 58 of length L having a tip 59. Each one of the terminals 52, 54, 56, and the cantilever arm 58, is made of a conductive material, e.g., a semiconductor or metal that conducts electric current. The cantilever arm 58 is a flexible, moveable member, extending out from the source terminal 52 to a distance beyond a nearest edge 60 of the drain terminal 56. The gate terminal 54 is disposed to the side of the cantilever arm 58. The cantilever arm 58 is spaced apart from the gate terminal 54 by a short distance so that when the gate terminal 54 is energized, the cantilever arm 58 is drawn toward the gate terminal 54. Because the tip 59 of the cantilever arm 58 moves more freely than the fixed end nearest the source terminal 52, the tip 59 can make contact with the drain terminal 56. When the tip 59 contacts the drain terminal 56, the switch 50 is closed, permitting flow of electric current between the source terminal 52 and the drain terminal 56, through the cantilever arm 58, which acts as a current channel.

Figure 1B:
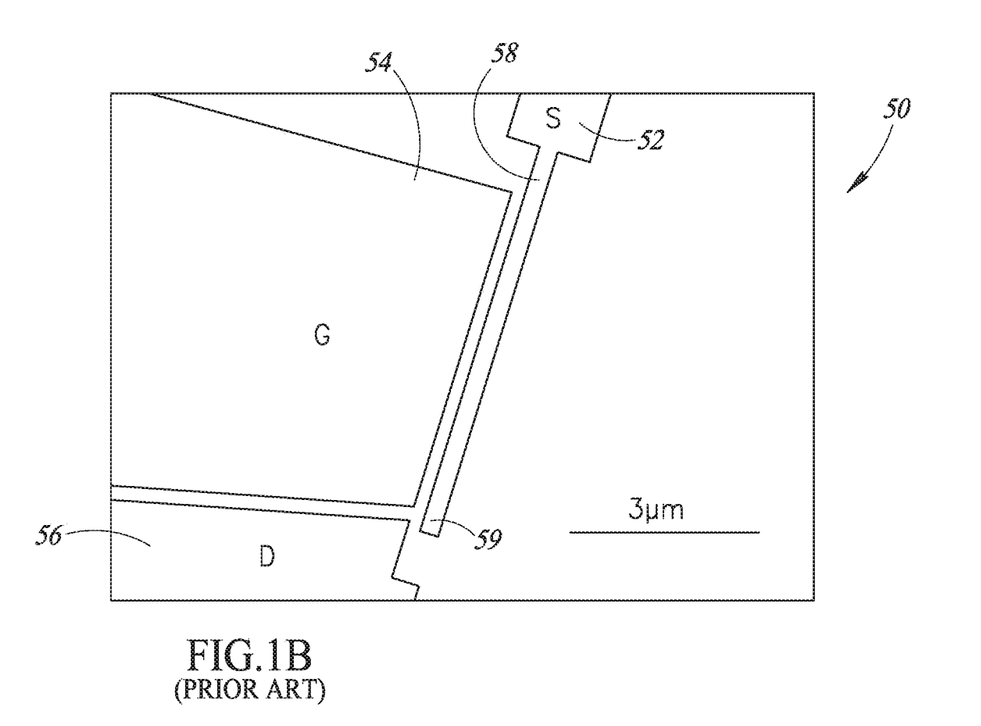
FIG. 1B is derived from a photograph showing a top plan view of the existing planar MEMs switch 50 shown in FIG. 1A, indicating a length scale.

FIG. 1B shows an enlarged view of the planar MEMs switching device 50 superimposed with a 3-μm length scale. The scale indicates that the cantilever arm 58 is about 10 μm long, which is consistent with the sizes of conventional MEMs devices. The overall footprint of the exemplary planar MEMs switch 50 is in the range of about 200 μm².

Figure 2:
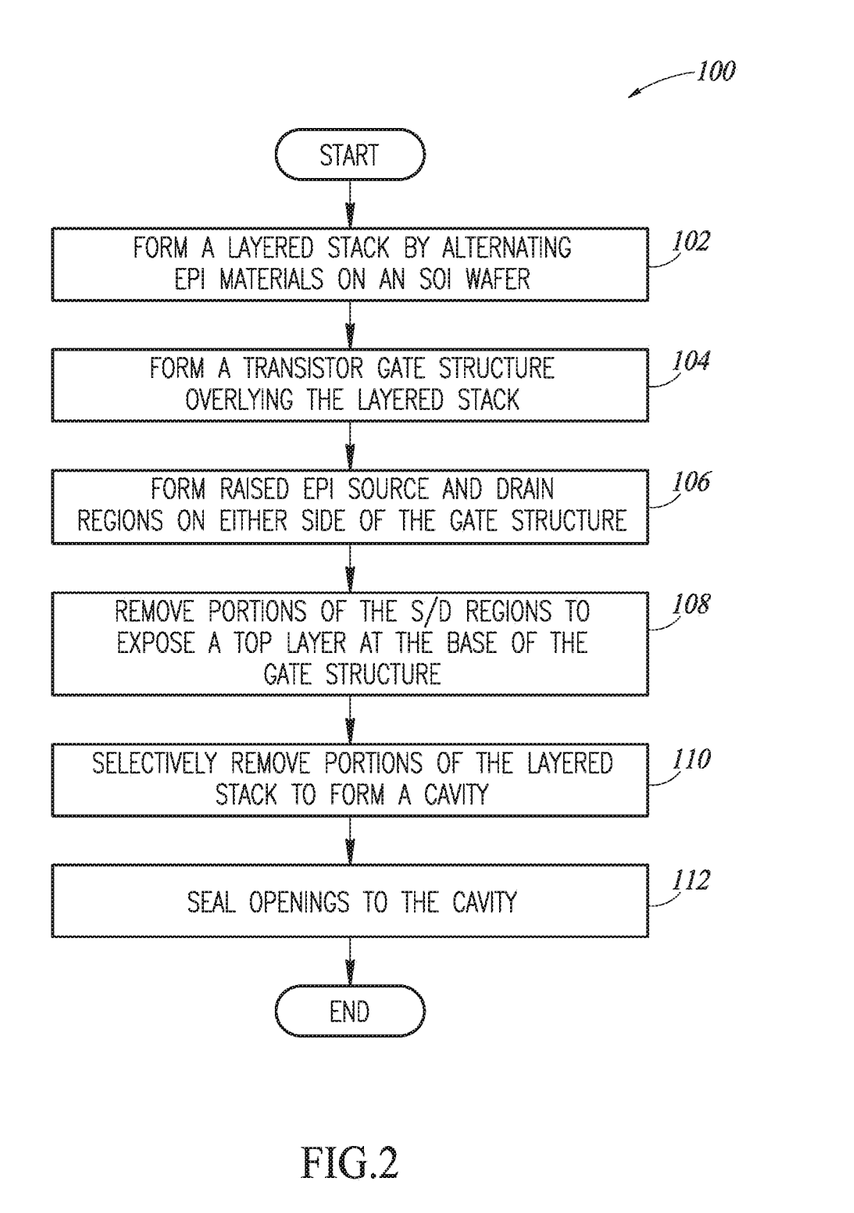
FIG. 2 is a flow diagram showing steps in a method of fabricating a nanoscale electromechanical switch as illustrated in FIGS. 3A-6B, according to one embodiment as described herein.
Figure 7:
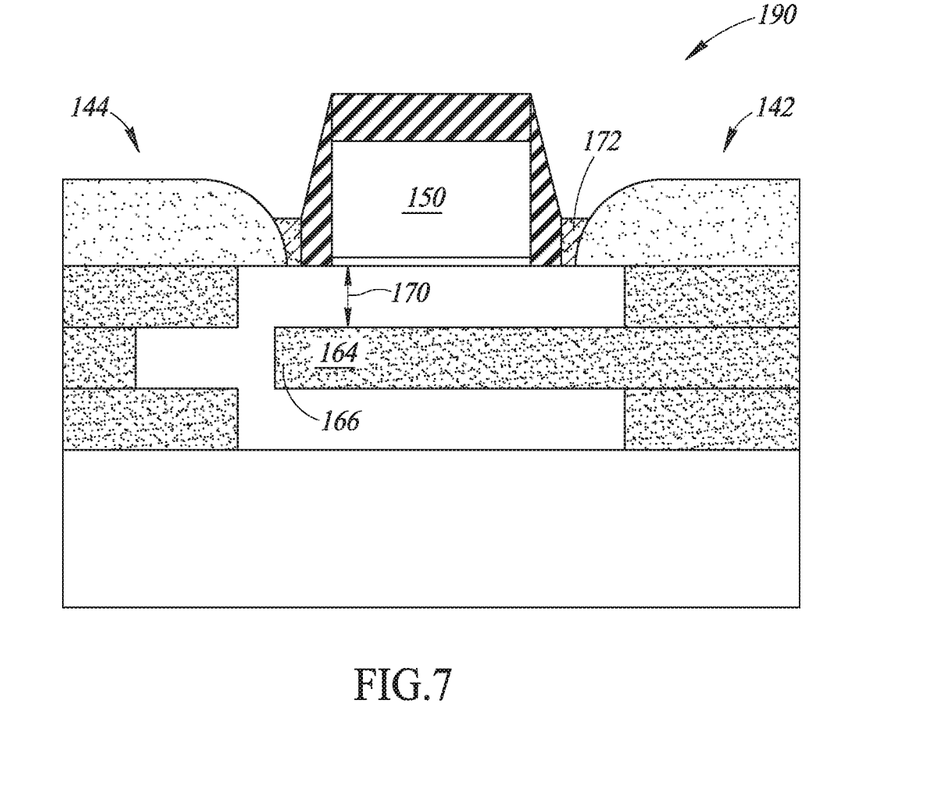
Figure 8A:
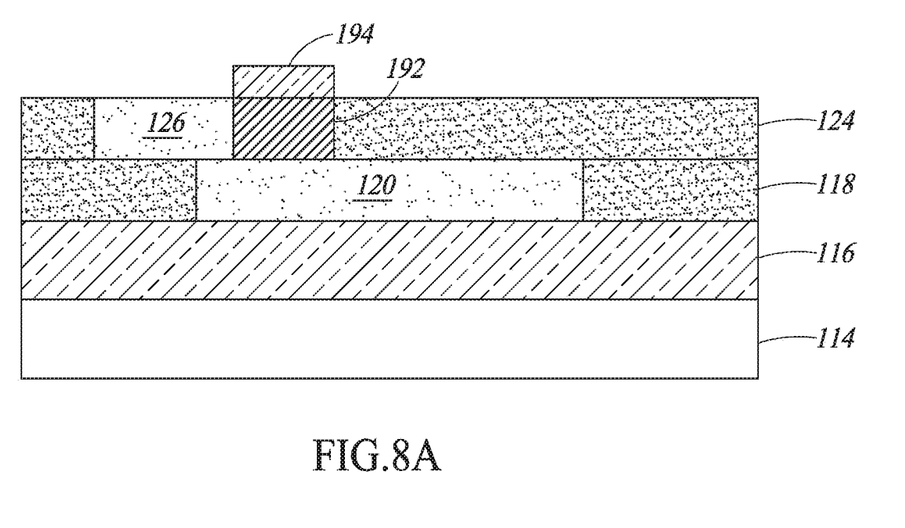
Figure 8B:
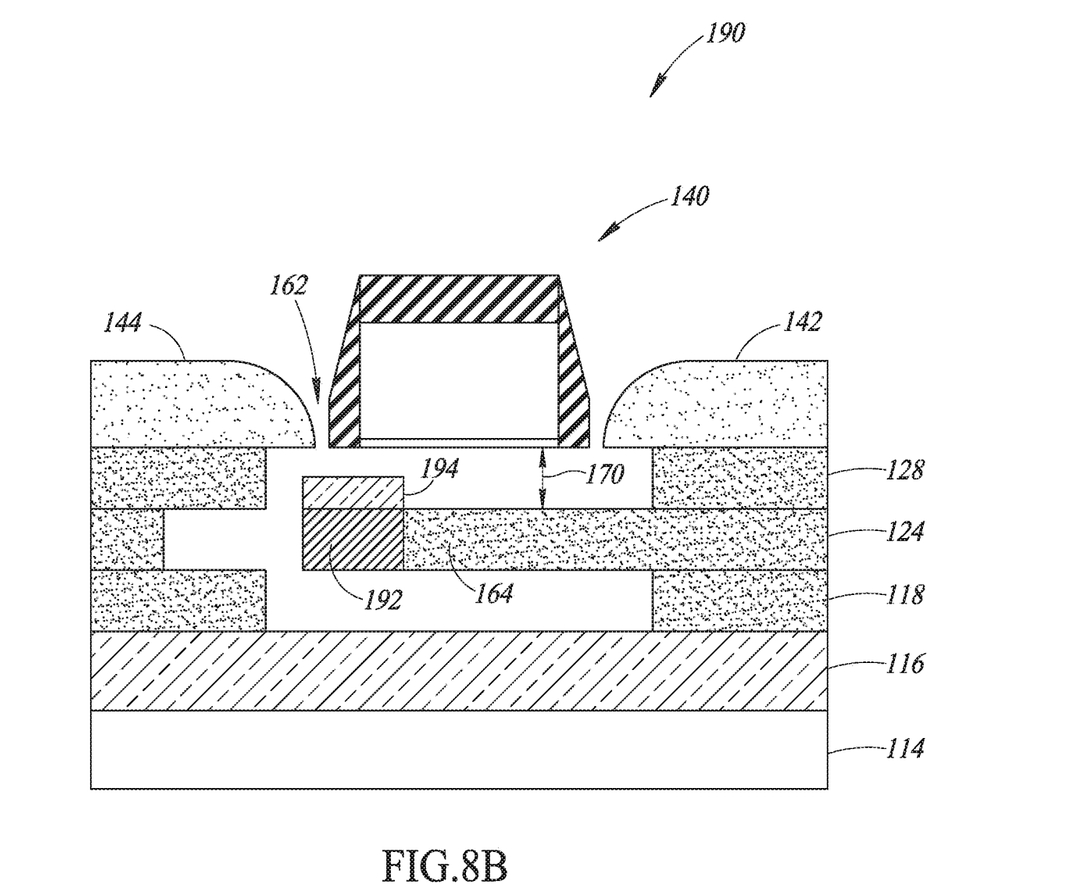
Figure 8C:
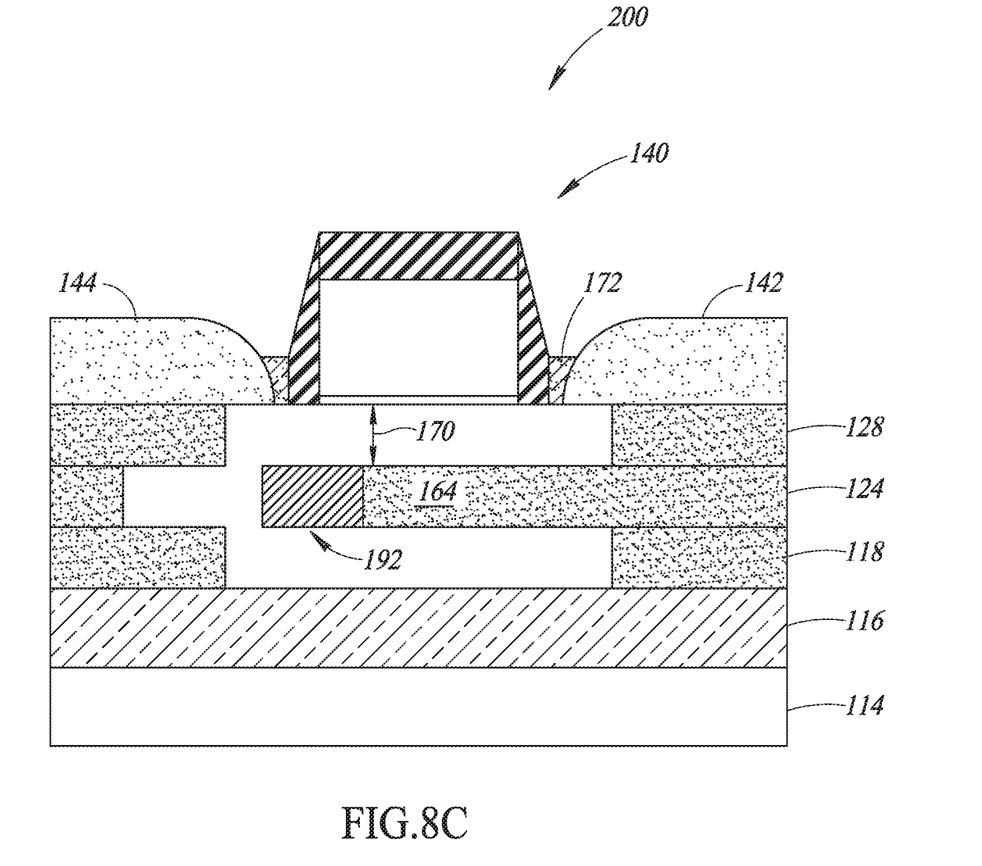

FIG. 2 shows steps in a method of fabricating a cantilever switch as a nanoscale transistor device suitable for use in integrated circuits, according to one embodiment. Unlike the planar MEMs switching device 50, the cantilever switch described herein is integrated into a layered semiconductor structure that forms an extension of the substrate, and the process for fabricating the cantilever switch is fully compatible with conventional CMOS processes. Steps in a method 100 for constructing such a nanoscale cantilever switch on a silicon-on-insulator (SOI) substrate are further illustrated by FIGS. 3-6B, and described below. A second embodiment built on a silicon substrate is shown in FIG. 7. Additional steps that can be used to construct a third embodiment are illustrated in FIGS. 8A-8C.

Figure 3A:
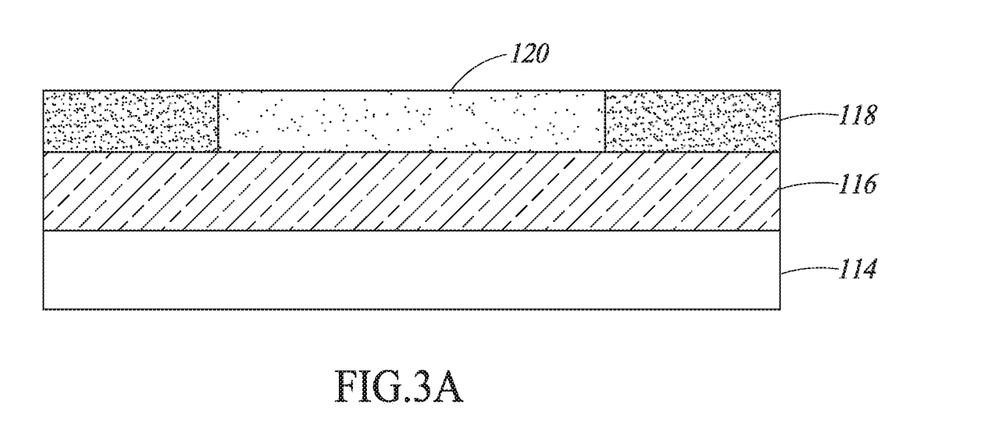
Figure 3B:
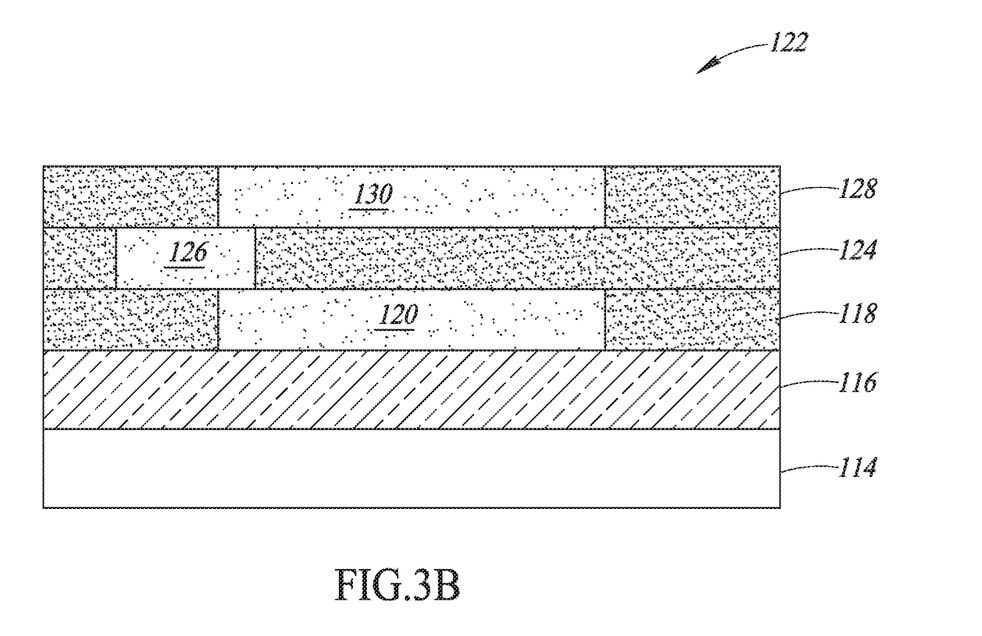

At 102, a layered stack 122 is formed by epitaxially growing layers of first and second semiconductor materials, e.g., silicon germanium (SiGe) and silicon in an alternating arrangement on an SOI wafer, as shown in FIGS. 3A and 3B. The SOI wafer includes a silicon substrate 114, a buried oxide (BOX) layer 116 of thickness in the range of about 15-25 nm and, above the BOX layer 116, an overlying silicon layer 118 having a thickness in the range of about 10-15 nm. Such an SOI wafer is a standard starting material that is commonly used in the semiconductor industry. Alternatively, a silicon wafer can be used as the starting material, and the BOX layer 116 and the overlying silicon layer 118 can be formed as initial steps of the present fabrication process. In one embodiment, a first region of SiGe 120 is formed at a same level as the overlying silicon layer 118 as follows: first, a hard mask having a first layer of silicon dioxide ($SiO_2$) and a second layer of silicon nitride (SiN) is formed on the overlying silicon layer 118. The hard mask is patterned to remove a portion corresponding to the desired size of the SiGe 120, and SiGe is epitaxially grown from the exposed surface of the overlying silicon layer 118. The $SiO_2$ layer of the hard mask protects the overlying silicon layer 118 from contacting the SiN layer at high temperatures during the epitaxy. Then germanium from the SiGe region is driven downward into the overlying silicon layer 118 using a condensation process that is known in the art. The hard mask layer is then removed to produce the structure shown in FIG. 3A.

Next, a first additional silicon layer 124 that incorporates a second region of SiGe 126 is formed. In one embodiment, the first additional silicon layer 124 is grown epitaxially from the overlying silicon layer 118 to a thickness in the range of about 15-30 nm. The thickness of the first additional silicon layer 124 will determine the thickness, and will influence the flexibility, of the cantilever for the nanomechanical switch. The first additional silicon layer 124 can be doped in-situ during the epitaxy process, or by implantation, with negative ions, e.g., arsenic or phosphorous, to a concentration in the range of about $8.0\,E19\text{-}3.0\,E20\ cm^{-3}$. The first additional silicon layer 124 is then patterned, using a SiO2/SiN hard mask, to form an opening that is surrounded by silicon material. The second region of SiGe 126 can then be grown epitaxially to fill the opening using the same technique just described. The SiO2/SiN hard mask is then removed.

Next, an additional silicon layer 128 that incorporates a third region of SiGe 130 is formed. In one embodiment, the additional silicon layer 128 is grown epitaxially from the first additional silicon layer 124 to a thickness in the range of about 10-15 nm. The thickness of the additional silicon layer 128 will determine a distance through which the cantilever will need to move to close the switch. Such a distance can be achieved with precision using epitaxy to form the additional silicon layer 128 and the third region of SiGe. The additional silicon layer 128 can be doped in-situ during the epitaxy process, or by implantation, with negative ions, e.g., arsenic or phosphorous, to a concentration in the range of about $1.0\text{-}2.0\,E20\ cm^{-3}$. The additional silicon layer 128 is then patterned, using a SiO2/SiN hard mask, to form an opening that, again, is surrounded by silicon material. The third region of SiGe 130 can then be grown epitaxially to fill the opening. The SiO2/SiN hard mask is then removed to produce the structure shown in FIG. 3B.

At 104, a conventional transistor gate structure 140 is formed on top of the third region of SiGe 130, overlying the layered stack. First, a thin layer, e.g., 2-5 nm of a dielectric material, e.g., $SiO_2$ or a high-k material such as $HfO_2$, is deposited, followed by layers of polysilicon and SiN. The $SiO_2$, polysilicon, and SiN are then patterned to form the gate structure 140, including a gate dielectric 148, a gate electrode 150, and an insulating cap 152. Insulating sidewall spacers 154 are then formed in the usual way by conformal deposition of, for example, SiN, followed by anisotropic removal of the SiN portion overlying the gate electrode 150 down to the SiN cap 152, leaving in place the sidewall portions of the SiN. The transistor gate structure 140 thus formed can be used as a mask for doping the additional silicon layer 128 to reduce resistance of the silicon. It will not matter if dopants are also incorporated into the third region of SiGe 130, because the SiGe regions in the present structure are sacrificial. Alternatively, a metal gate can be used instead of a polysilicon gate. A metal gate can be formed by any conventional method, e.g., by a replacement metal gate (RMG) process in which, after the transistor structure 140 is formed, the polysilicon gate electrode is removed and replaced by a metal gate electrode.

Figure 4:
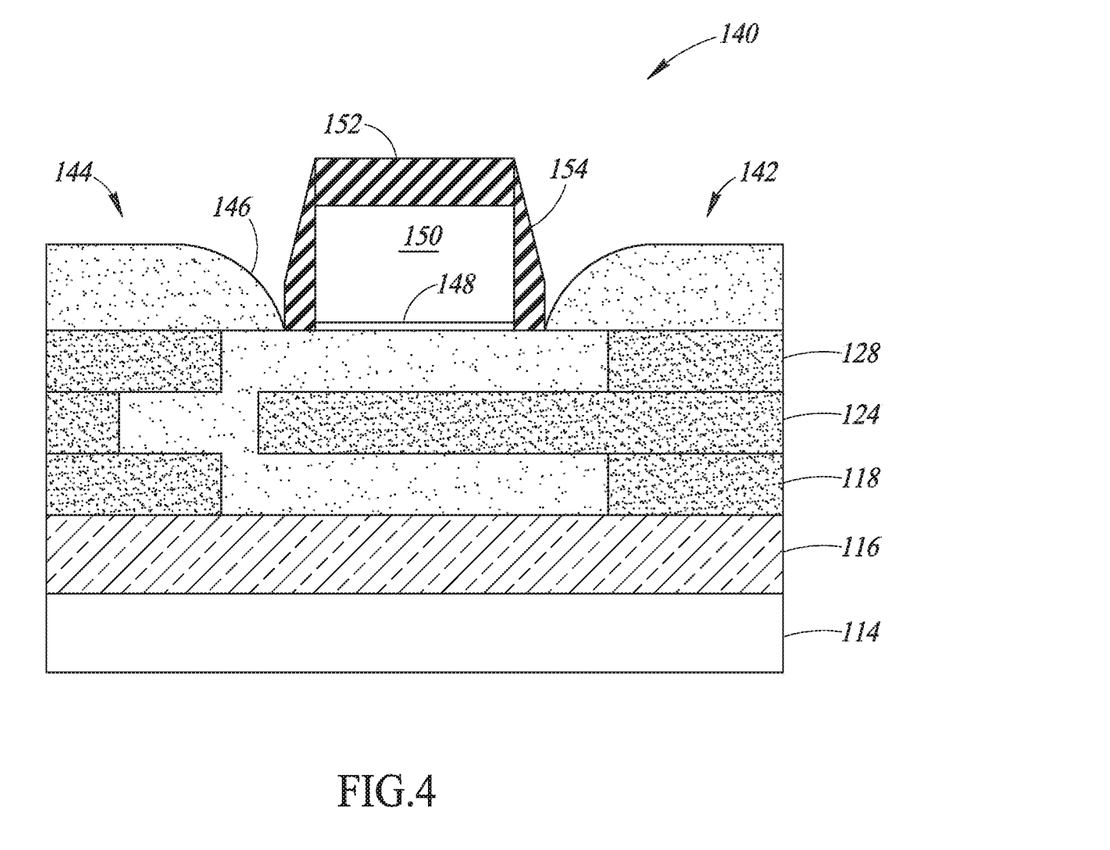

At 106, epitaxial raised source and drain regions 142, 144 are formed on either side of the transistor gate structure 140, as shown in FIG. 4. In one embodiment, the raised source and drain regions 142, 144 are grown epitaxially from the additional silicon layer 128 and the third region of SiGe 130 to a thickness in the range of about 20-35 nm. The raised source and drain regions 142, 144 can be doped in-situ with ions of a same polarity as those used to dope the first additional silicon layer 124. The raised source and drain regions 142, 144 include facets 146 sloping down to the base of the sidewall spacers 154.

At 108, portions of the raised source and drain regions 142, 144 are removed by a partially anisotropic etching process to form openings 162 at the base of the transistor gate structure 140, thus exposing the third SiGe region 130. The openings 162 are desirably in the range of 3-8 nm, thus leaving about a 5 nm gap between the base of the sidewall spacers 154 and the source and the inner corners of the faceted source and drain regions 142, 144.

Figure 5:
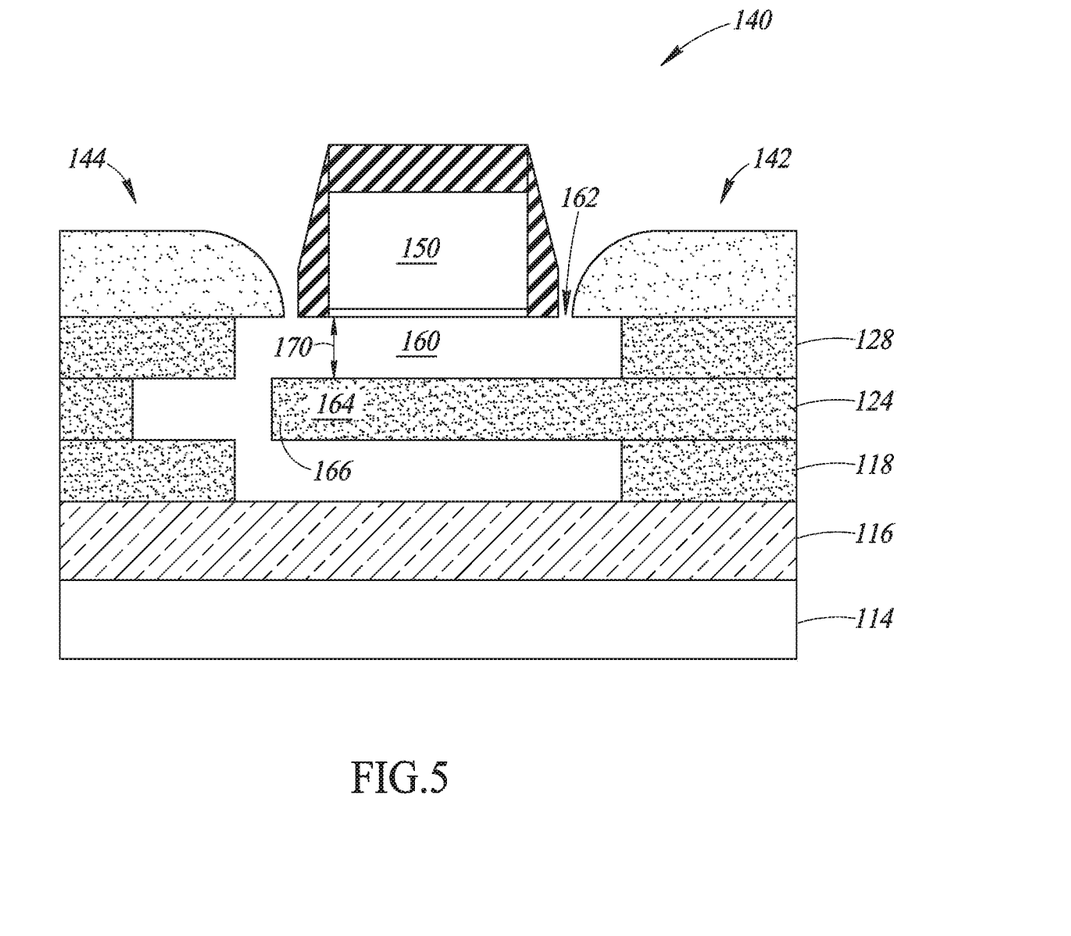
Figure 6A:
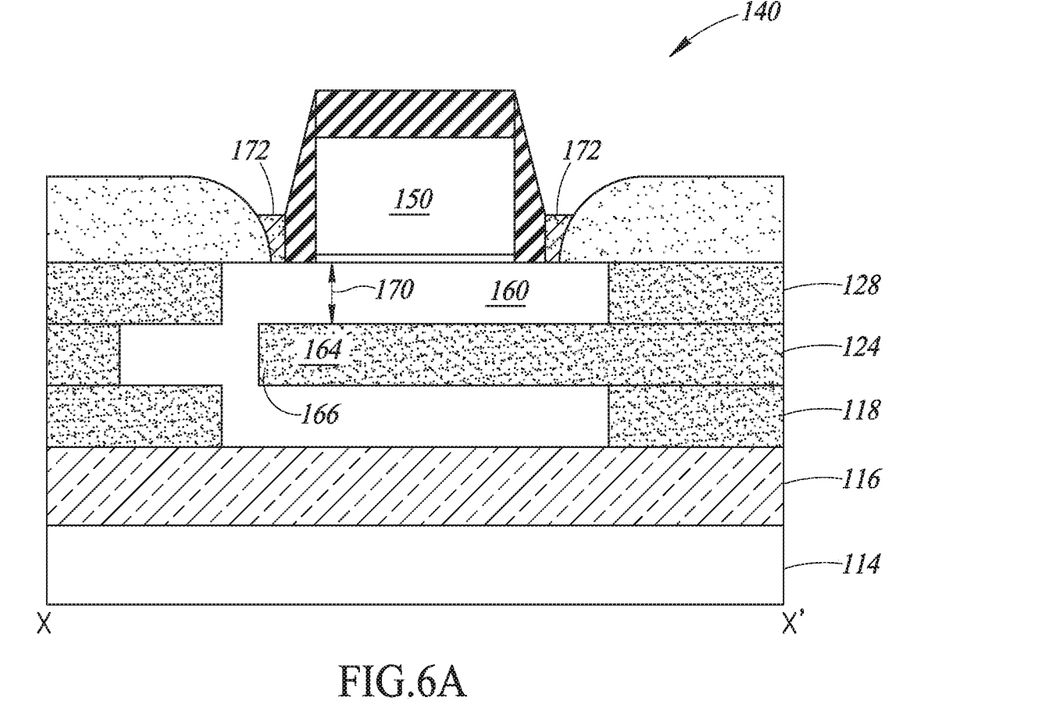
FIG. 6A is a cross-sectional view, of a completed nanoscale electromechanical switch, according to a first embodiment.

At 110, the SiGe portions of the layered stack are selectively removed to form a cavity 160 surrounding a cantilever arm 164 having a tip 166, as shown in FIGS. 5, 6A. In one embodiment, removal of sacrificial first, second, and third regions of SiGe, 120, 126, 130, respectively, is accomplished by exposing the layered stack to hydrochloric acid (HCL). The HCL will selectively etch the regions of SiGe, leaving behind various layers of silicon. First, the HCL attacks the third region of SiGe 130 directly below the openings 162, creating a void underneath the transistor gate structure 140. Then, because the HCL is a fluid, e.g., a liquid etchant, the HCL will flow into the voids thus created, and continue etching out the second region of SiGe 126, followed by the first region of SiGe 120, thus releasing the cantilever arm 164. The cantilever arm 164 is formed from remaining silicon in the first additional silicon layer 124 so that the cantilever arm 164 extends out from underneath the source region 142, into the cavity 160 directly below the transistor gate structure 140. When the SiGe removal step 110 is complete, the cantilever arm 164 can flex freely within the cavity 160, toward or away from the transistor gate structure 140, based on an electric potential of the gate electrode 150 relative to an electric potential of the cantilever arm 164.

In operation, when a sufficient positive voltage, exceeding a threshold value, is applied to the gate electrode 150, the doped cantilever arm 164, is deflected toward the oppositely doped gate. The cantilever arm 164 may flex enough that the tip 166 makes physical and electrical contact with the base of the drain region 144. When such contact occurs, the electromechanical switch is closed as a current path is established from the source region 142 to the drain region 144, wherein the cantilever arm 164 serves as a transistor channel. The threshold voltage can be tuned during fabrication by adjusting the thickness of the additional silicon layer 128. In addition, a voltage, e.g., in the range of about 3-4 V can be applied via a backside electrical contact to the silicon substrate 114 to back-bias the BOX layer 116, so as to repel the cantilever arm 164 and assist in moving the tip 166 toward the drain region 144. The BOX layer 116 thus may serve as a back gate. When the voltage applied to the gate electrode 150 no longer exceeds the threshold voltage, the cantilever arm 164 relaxes and returns to its original extended position. Alternatively, the cantilever arm 164 and the source and drain regions 142, 144 can be positively doped to form a p-type device for which, in operation, a negative voltage is applied to the gate electrode 150.

In the extended position, the switch is open, i.e., an open circuit exists between the source 142 and the drain 144. Thus, in the off state, no current flows through the cantilever arm 164. Furthermore, because the cavity 160 is positioned directly underneath the transistor gate structure 140, charge cannot leak from the tips of the source and drain regions 142, 144 into the substrate. A small amount of charge may migrate from the source and drain regions 142, 144 into the silicon layers 128, 124, 118 in response to localized electric fields. However, a current cannot flow from the source region 142 to the drain region 144 because the electrical path is blocked by either the cavity 160 or the insulating BOX layer 116. Thus, the off-state leakage current is zero, preventing drainage of electric battery power supplied to the transistor. For the cantilever arm 164 to be flexible enough to open and close the switch, the cantilever arm 164 is designed to have suitable mechanical properties and dimensions that will allow the cantilever arm to respond to voltage levels used in integrated circuits, in the range of about 0.5-1.0 V. In one embodiment, the cantilever arm 164 has an aspect ratio of at least about 4.0, and the threshold voltage is about 0.8 V.

More generally, the switching action can be the result of one or more of a capacitive, electrostatic, or inductive effect. For example, the gate electrode 150, drain region 144, and cantilever arm 164 may incorporate electromagnetic materials having magnetic properties that are responsive to the influence of a voltage applied to the gate electrode 150.

At 112, the openings 162 are sealed with a glass material 172, to form a completed structure as shown in FIG. 6A. In one embodiment the glass material 172 is a spin-on glass (SOG), a material well known in the art. The spin-on glass is a liquid material having a high viscosity at temperatures less than 100° C., which can be cured, following deposition, to form a solid state glass. Alternatively, $SiO_2$ can be sputtered over the openings 162 to form a seal. Once the openings 162 are sealed, the glass material 172 can then be recessed below the top surfaces of the source and drain regions 142, 144.

Figure 6B:
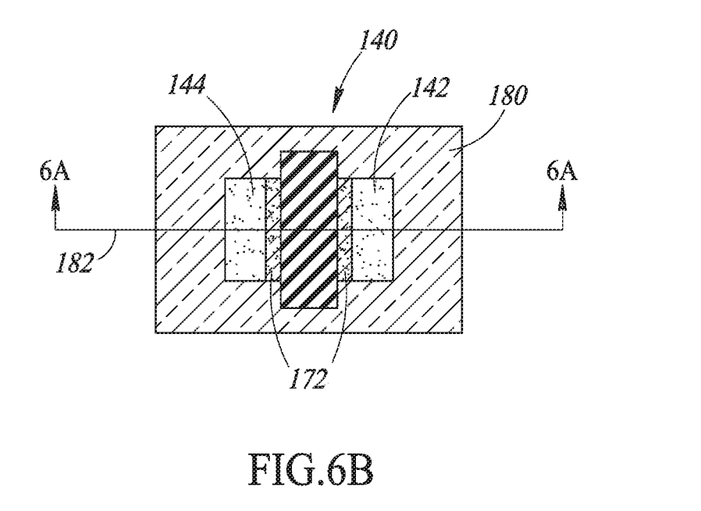
FIG. 6B is a top plan view of the completed nanoscale electromechanical switch shown in FIG. 6A.

FIG. 6B shows that the transistor gate structure 140 is anchored on isolation regions 180, e.g., silicon dioxide insulating structures separating adjacent devices from one another. The isolation regions 180 extend behind and in front of a cut plane 182 of the cross-sectional views shown in FIGS. 3A-6A. Thus, in FIGS. 5 and 6A, the transistor gate structure 140 appears to be floating over the cavity 160, but actually, the transistor gate structure 140 forms a bridge that extends over the cavity 160 in a direction transverse to the cut plane 182.

FIG. 7 shows a second embodiment of the nanoscale electromechanical switch in which the BOX layer 116 is omitted. In the second embodiment, SiGe can be formed at the same level as the overlying silicon layer 118 by simply growing the SiGe epitaxially from the underlying silicon substrate 114. Alternatively, the overlying silicon layer 118 can be formed as a SiGe layer and patterned to incorporate regions of silicon, to achieve the same structure shown in FIG. 7. However, the embodiment shown in FIG. 7 will not have the option of applying a back bias to the device to assist in moving the cantilever arm 164. Doing so without the BOX layer 116 in place would simply short out the transistor by coupling the source to the drain through the silicon substrate 114 and the intervening additional layers of silicon 118, 124, 128. Alternatively, the second embodiment shown in FIG. 7 can be fabricated using the condensation process described above.

FIGS. 8A-8C illustrate a third embodiment of nanoscale electromechanical switch 200 in which sensitivity of the device is enhanced by fabricating the tip 166 from a metal, e.g., tungsten (W). Such a modification can be made to step 102, as shown in FIGS. 8A-8B. FIG. 8A shows incorporating a metal tip 192 into the first additional silicon layer 124. Following formation of the second SiGe region 126, a SiN hard mask is deposited and patterned with an opening that aligns with the leftmost end of the doped silicon that will be the cantilever arm 164. The tip 166 of the cantilever arm 164 is then etched away and replaced with the metal tip 192, e.g., by depositing tungsten and polishing the tungsten surface to stop on the SiN hard mask. While the SiN hard mask is still in place, the tungsten is recessed and the recessed area is filled with an oxide, e.g., SiO$_2$, to form an oxide mask 194 covering the metal tip 192. The oxide is planarized to stop on the SiN hard mask. Then the SiN hard mask is removed, leaving the oxide mask 194 covering the metal tip 192. The oxide mask prevents exposure of the metal tip 192 during the subsequent epitaxial growth of the second additional silicon layer and the third region of SiGe. After the cavity 160 is formed (FIG. 8B), the oxide mask can be removed in an isotropic dry etch process that is selective to silicon and oxide. In one embodiment, the dry etch process employs a known etchant that is typically used to remove silicon-cobalt-nickel (SiCoNi) films. The etchant can enter the cavity 160 through the opening 162 adjacent to the drain region 144. FIG. 8C shows the completed third embodiment of the nanoscale electromechanical switch 200. During operation, a metal tip 196 helps reduce contact resistance between the cantilever arm 164 and the doped drain region 144.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A device, comprising:
a substrate;
a first semiconductor layer on the substrate, the first semiconductor layer including a first opening;
a second semiconductor layer on the first semiconductor layer, the second semiconductor layer including a second opening;
a third semiconductor layer on the second semiconductor layer, the third semiconductor layer including a third opening, the second semiconductor layer including an extension that overlaps the first and third openings;
a gate on the third semiconductor layer and aligned with the extension of the second semiconductor layer.

2. The device of claim 1, further comprising:
a source region on the third semiconductor layer adjacent to a first side of the gate; and
a drain region on the third semiconductor layer adjacent to a second side of the gate.

3. The device of claim 2 wherein each of the source region and the drain region extends at least partially over the third opening.

4. The device of claim 2 wherein the source region and the drain region are spaced apart from the adjacent first side and the adjacent second side of the gate, respectively.

5. The device of claim 4, further comprising a sealant between the source region and the adjacent first side of the gate and between the drain region and the adjacent second side of the gate.

6. The device of claim 1, further comprising:
a metal tip attached to the extension of the second semiconductor layer, the metal tip extends between an end of the extension and the second opening.

7. The device of claim 1 wherein the first and third openings are aligned with one another and the second opening partially overlaps the first and third openings.

8. The device of claim 1, further comprising a buried oxide layer between the substrate and the first semiconductor layer.

9. The device of claim 1 wherein the first, second, and third semiconductor layers are silicon layers.

10. The device of claim 1 wherein the first semiconductor layer has a thickness within a range of 10 nm to 15 nm, inclusive, the second semiconductor layer has a thickness within a range of 15 nm to 30 nm, inclusive, and the third semiconductor layer has a thickness within a range of 10 nm to 15 nm, inclusive.

11. A device, comprising:
a substrate;
a buried oxide layer on the substrate;
a plurality of semiconductor layers on the buried oxide layer, the plurality of semiconductor layers defining a cavity that extends through each of the plurality of semiconductor layers, and a cantilever that extends into the cavity, the cantilever being part of one of the plurality of semiconductor layers; and a gate on the plurality of semiconductor layers and aligned with the cavity.

12. The device of claim 11 wherein the plurality of semiconductor layers includes:

a first semiconductor layer on the buried oxide layer;

a second semiconductor layer on the first semiconductor layer; and a third semiconductor layer on the second semiconductor layer, wherein the cantilever is a part of the second semiconductor layer, and the cavity includes a first portion that extends through the first semiconductor layer, a second portion that extends through the second semiconductor layer, and a third portion that extends through the third semiconductor layer.

13. The device of claim 12 wherein the first portion and the third portion of the cavity are aligned with one another and the second portion partially overlaps the first and the third portions.

14. The device of claim 11, further comprising a metal tip attached to an end of the cantilever.

15. The device of claim 11, further comprising an insulating material surrounding a perimeter of the plurality of semiconductor layers, the gate being anchored to the insulating material and suspended over the cavity.

16. An electromechanical switch, comprising:

a substrate having a first surface;

a plurality of semiconductor layers on the substrate;

a cavity that extends through each of the plurality of semiconductor layers;

a cantilever that extends into the cavity along a direction parallel to the surface of the substrate, the cantilever being a part of at least one of the plurality of semiconductor layers;

a gate suspended over the cavity;

a source region on the plurality of semiconductor layers and adjacent to a first side of the gate; and a drain region on the plurality of semiconductor layers and adjacent to a second side of the gate opposite to the first side.

17. The electromechanical switch of claim 16, further comprising a metal tip attached to an end of cantilever.

18. The electromechanical switch of claim 16, further comprising an insulating material surrounding a perimeter of the plurality of semiconductor layers, the gate being suspended over the cavity by the insulating material.

19. The electromechanical switch of claim 16 wherein the drain region extends at least partially over the cavity and the cantilever is a flexible cantilever that is operable to contact the drain region in response to a voltage being applied to the gate.

20. The electromechanical switch of claim 16, further comprising a glass sealant between the source region and the first side of the gate and between the drain region and the second side of the gate.

* * * * *